US006137314A

United States Patent [19]

Buck

[11] Patent Number: 6,137,314

[45] Date of Patent: Oct. 24, 2000

[54] INPUT CIRCUIT FOR AN INTEGRATED CIRCUIT

[75] Inventor: Martin Buck, München, Germany

[73] Assignee: Siemens Aktiengesellschaft, Munich, Germany

[21] Appl. No.: 09/450,403

[22] Filed: Nov. 29, 1999

Related U.S. Application Data

[63] Continuation of application No. PCT/DE98/01098, Apr. 20, 1998.

[30] Foreign Application Priority Data

May 27, 1997 [DE] Germany ........................... 197 22 158

[51] Int. Cl.[7] ............................................ H03K 19/0175

[52] U.S. Cl. .............................. 326/83; 326/112; 326/49; 327/89

[58] Field of Search ................................ 326/82, 83, 86, 326/112, 119, 121, 49–50, 37; 327/78, 88, 89, 85

[56] References Cited

U.S. PATENT DOCUMENTS

| | | |
|---|---|---|
| 4,745,305 | 5/1988 | Crafts . |
| 5,440,248 | 8/1995 | Brown et al. . |
| 5,455,524 | 10/1995 | Ikeya . |
| 5,612,637 | 3/1997 | Shay et al. ................................ 326/86 |
| 5,710,516 | 1/1998 | Kim ........................................ 326/115 |

FOREIGN PATENT DOCUMENTS

| | | |
|---|---|---|
| 0105685A2 | 4/1984 | European Pat. Off. . |
| 62-210727 | 9/1987 | Japan . |
| 3-132112A | 6/1991 | Japan . |
| 4-223617A | 8/1992 | Japan . |

OTHER PUBLICATIONS

"CMOS Selectable NAND–NOR Circuit" in IBM Technical Disclosure Bulletin, vol. 33, No. 3B, Aug. 1990, pp. 385–387.

*Primary Examiner*—Michael Tokar
*Assistant Examiner*—James H Cho
*Attorney, Agent, or Firm*—Herbert L. Lerner; Laurence A. Greenberg; Werner H. Stemer

[57] ABSTRACT

An input circuit has an inverter and a differential amplifier, which are respectively connected on an input side to an input and on an output side to an output of the input circuit. The input circuit has two operating modes defined by an activation signal, the differential amplifier being activated and the inverter being deactivated in a first operating mode, and the differential amplifier being deactivated and the inverter being activated in a second operating mode. In this manner, the input circuit has the advantage of selective operation with LVTTL or SSTL levels.

9 Claims, 1 Drawing Sheet

D
VDD
ACT
VDD
I
P4
P1
P2
P5
P3
K1
K2
INV
OUT
N1
N2
VREF
EN
N3
IN

VREF
INV
INV
ACT

U [V]
VDD
ACT
VREF
t
t0
t1
t2

INPUT CIRCUIT FOR AN INTEGRATED CIRCUIT

CROSS-REFERENCE TO RELATED APPLICATION

This is a continuation of copending International Application PCT/DE98/01098, filed Apr. 20, 1998, which designated the United States.

BACKGROUND OF THE INVENTION

Field of the Invention

The invention relates to an input circuit for an integrated circuit.

Input circuits of integrated circuits for digital signals, which have two levels that are close to two supply potentials of the input circuit, are often produced using an inverter. Such input signals (hereafter "standard digital signals") are encountered, for example, in so-called TTL logic or LVTTL logic (low voltage TTL).

On the other hand, other integrated circuits are supplied with input signals that have two levels that respectively represent a positive and negative difference in relation to a reference level. For such input signals (hereafter "differential signals") it is possible to use, as input circuits, differential amplifiers to which the reference level is fed as a comparative value, while the input signal is applied to their input. Such differential signals are used, for example, in so-called SSTL logic. Values typical of SSTL logic are 1.4 V for the reference level, 1.44 V–0.3 V for the negative level and 1.4 V+0.3 V for the positive level.

U.S. Pat. No. 5,455,524 describes an input circuit that has a series circuit containing two inverters and a series circuit containing two differential amplifiers. In a first operating mode, the two differential amplifiers are activated and the inverters are deactivated, and ECL input signals are fed to the circuit. In a second operating mode, the differential amplifiers are deactivated and the inverters are activated, and CMOS input signals are fed to the circuit. The differential amplifiers and inverters are respectively embodied by different components.

SUMMARY OF THE INVENTION

It is accordingly an object of the invention to provide an input circuit for an integrated circuit which overcomes the above-mentioned disadvantages of the prior art devices of this general type, which can be embodied using relatively few components and is versatile.

With the foregoing and other objects in view there is provided, in accordance with the invention, an input circuit, containing:

a circuit input;

a circuit output;

a first supply terminal;

a second supply terminal;

a differential amplifier having an input connected to the circuit input and an output connected to the circuit output, the differential amplifier, including:

- a first series circuit having at least one first transistor of a first channel type with a gate and a drain, a circuit node, and a second transistor of a second channel type with a gate and a drain disposed between the first supply terminal and the second supply terminal, the circuit node disposed between the at least one first transistor and the second transistor functioning as the output of the differential amplifier;
- a second series circuit having at least one third transistor of the first channel type with a gate and a drain and a fourth transistor of the second channel type with a gate and a drain disposed between the first supply terminal and the second supply terminal;
- the gate of the at least one first transistor connected to the gate of the at least one third transistor;
- the gate and the drain of the at least one third transistor connected to one another;
- the gate of the second transistor being the input of the differential amplifier;
- a reference signal terminal; and
- the gate of the fourth transistor connected to the reference signal terminal;

an inverter having an inverter input connected to the circuit input and an inverter output connected to the circuit output, the inverter, including:

- a third series circuit containing at least one fifth transistor of the first channel type with a gate and a drain, an inverter circuit node, and the second transistor disposed between the first supply terminal and the second supply terminal, the inverter circuit node disposed between the at least one fifth transistor and the second transistor being the inverter output of the inverter; and
- the gate of the at least one fifth transistor and the gate of the second transistor being the inverter input of the inverter; and the inverter and the differential amplifier receiving an activation signal defining two operating modes including a first operating mode and a second operating mode, the differential amplifier being activated and the inverter being deactivated in the first operating mode, and the differential amplifier being deactivated and the inverter being activated in the second operating mode.

The input circuit according to the invention has both an inverter and a differential amplifier, which are respectively connected on the input side to the input and on the output side to the output of the input circuit. The input circuit has two operating modes, with, on a basis of an activation signal, the differential amplifier being activated and the inverter being deactivated in the first operating mode, and the differential amplifier being deactivated and the inverter being activated in the second operating mode. Thus, only the differential amplifier is active in the first operating mode, and the inverter in the second operating mode. It is therefore possible for differential signals (for example with SSTL levels) to be applied to the input of the input circuit in the first operating mode, and standard digital signals (for example with TTL levels) in the second operating mode.

In a developed form of the invention, a reference signal that can be fed to the differential amplifier has different levels in the two operating modes, and the activation signal is derived from the reference signal. In the simplest case, the activation signal may then, for example, be equal to the reference signal. It is, however, also possible for the activation signal to be the inverse of the reference signal or, to produce higher levels of the activation signal, to be generated from the reference signal by amplification. Deriving the activation signal from the reference signal gives the advantage that only one of these two signals needs to be fed to the input circuit. For example, in SSTL logic, it is in any case common place for the required reference signal to be made available externally, that is to say off-chip, in order to make it easy to change the level of the reference signal.

Other features which are considered as characteristic for the invention are set forth in the appended claims.

Although the invention is illustrated and described herein as embodied in an input circuit for an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
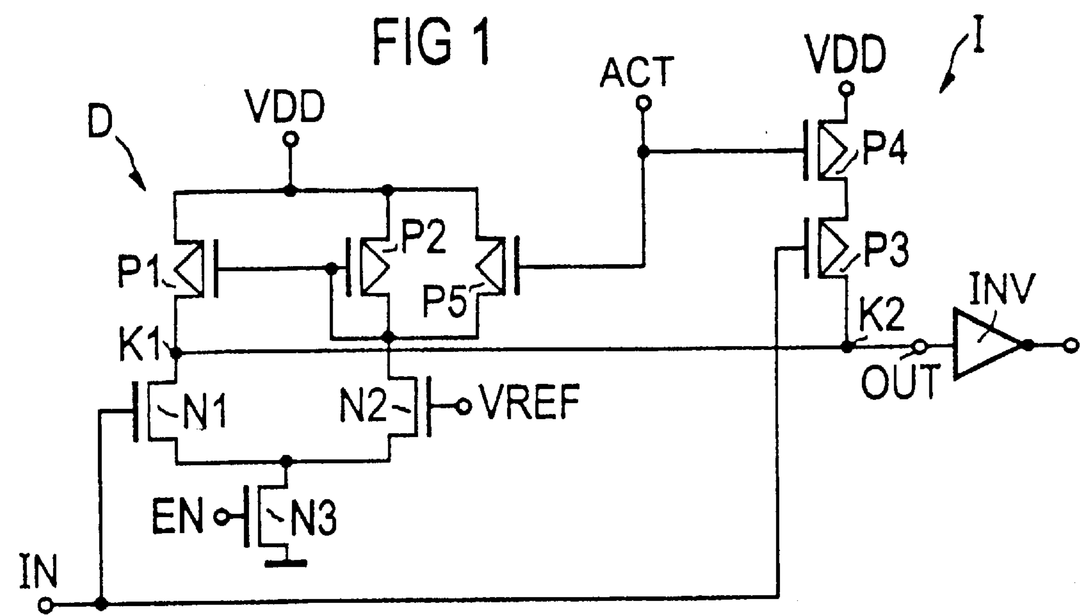
FIG. 1 is a diagrammatic, circuit diagram of an illustrative embodiment of an input circuit according to the invention.

DESCRIPTION OF THE PREFERRED EMBODIMENTS:

In all the figures of the drawing, sub-features and integral parts that correspond to one another bear the same reference symbol in each case. Referring now to the figures of the drawing in detail and first, particularly, to FIG. 1 thereof, there is shown a differential amplifier D, which has two p-channel transistors P1, P2 and two n-channel transistors N1, N2. A gate of the first n-channel transistor N1 is an input of the differential amplifier D, which is connected to an input IN of an input circuit. A gate of the second n-channel transistor N2 is connected to a reference signal VREF which can be fed to the input circuit from the outside.

In addition, there is a third n-channel transistor N3, to whose gate it is possible to apply an enable signal EN that is used for activating or deactivating the overall input circuit. Although providing the third n-channel transistor N3 at the described point allows simple and reliable deactivation and activation of the overall input circuit, in other embodiments of the invention it may be omitted or replaced by enable circuit components provided at other points.

Further, the input circuit represented in FIG. 1 has an inverter I in the form of a CMOS inverter which is formed by a third p-channel transistor P3 and the first n-channel transistor N1 of the differential amplifier D. The gates of these two transistors P3, N1 are likewise connected to an input IN of the input circuit and form the input of the inverter I.

An output K1 of the differential amplifier D and an output K2 of the inverter I are both connected to an output OUT of the input circuit. The differential amplifier D and the inverter I are thus connected in parallel in relation to the input IN and the output OUT of the input circuit. Connected downstream of the output OUT there is a further inverter INV which is used to amplify the signal at the output OUT and, in other embodiments of the invention, may also be omitted.

The input circuit in FIG. 1 further has an activation signal ACT, by which the differential amplifier D is activated and the inverter I is deactivated in a first operating mode of the input circuit, and the differential amplifier D is deactivated and the inverter I is activated in the second operating mode. In order for the inverter I to be activated and deactivated, it has, between the first supply potential VDD and its p-channel transistor P3, a fourth p-channel transistor P4 whose gate has the activation signal ACT applied to it. The activation and deactivation of the differential amplifier D, which reciprocates with the activation and deactivation of the inverter I, takes place using a fifth p-channel transistor P5 which is connected with its current-carrying path in parallel with that of the second p-channel transistor P2. A gate of the fifth p-channel transistor P5 has the activation signal ACT in turn applied to it.

Figure 2:
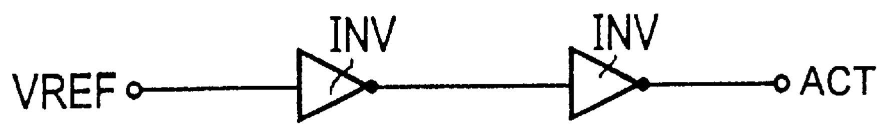
FIG. 2 is a circuit diagram for generating an activation signal from a reference signal.

FIG. 2 shows a circuit with which the activation signal ACT is derived from the reference signal VREF using two inverters INV connected in series. Instead of inverters, the required amplification may also be achieved in a different way, e.g. using a differential amplifier.

Figure 3:
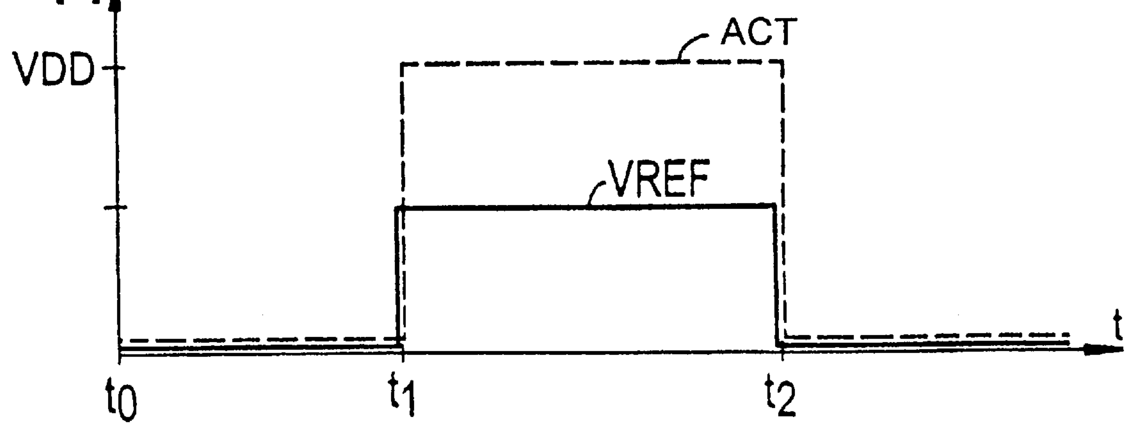
FIG. 3 is a graph of a profile of the signals represented in FIG. 2 as a function of changes between two operating modes of the input circuit.

FIG. 3 shows the signal profile of the reference signal VREF and of the activation signal ACT, which is associated with the circuit in FIG. 2. Between times t0 and t1, the input circuit is in the second operating mode. The externally supplied reference signal VREF is at ground potential, since it is not required for the second operating mode. Consequently, the activation signal ACT obtained from the reference signal VREF by amplification is also at ground potential. Owing to the ground potential of the reference signal VREF, the second n-channel transistor N2 of the differential amplifier D is off. In the second operating mode, it is not therefore possible for current to flow through it, even if the enable transistor N3 is turned on using the enable signal EN. Since, in the second operating mode, the activation signal ACT is also at ground potential, the fifth p-channel transistor P5 is turned on and therefore bypasses the second p-channel transistor P2 of the differential amplifier D. In the second operating mode, the first supply potential VDD is therefore also applied to the gate of the first p-channel transistor P1, which ensures that the latter is off. It is not therefore possible for current to flow through the first p-channel transistor P1 from the first potential VDD to the output OUT of the input circuit.

The ground potential of the activation signal ACT in the second operating mode has the effect, together with the above-described deactivation of the differential amplifier D, that the fourth p-channel transistor P4 is turned on. The inverter I, consisting of the third p-channel transistor P3 and of the first n-channel transistor N1, is therefore activated and ready to receive input signals with TTL levels at the input IN of the input circuit, while the differential amplifier D is deactivated.

FIG. 3 shows, between times t1 and t2, the levels of the reference signal VREF and of the activation signal ACT during the first operating mode of the input circuit. The externally supplied reference signal VREF must, for meaningful comparison by the differential amplifier D, be smaller than the first supply potential VDD and greater than the threshold voltage of the second n-channel transistor N2. In the present case, its high level is about half as great as VDD. Through amplification according to FIG. 2, the activation signal ACT has a high level of amplitude VDD. Consequently, both the fourth p-channel transistor P4 is off, by which the inverter I is deactivated, and the fifth p-channel transistor P5, so that the second p-channel transistor P2 of the differential amplifier D is not bypassed in the first operating mode. The differential amplifier D is therefore activated in the first operating mode and ready to receive differential signals at the input IN of the input circuit.

After time t2 in FIG. 3, the signal profile for another change from the first operating mode to the second operating mode is indicated.

The input circuit in FIG. 1 has the advantage that, through shared use of the first n-channel transistor N1 by the differential amplifier D (in the first operating mode) and the inverter I (in the second operating mode), fewer circuit components are needed for its embodiment. For the selective activation/deactivation of the differential amplifier D and of the inverter I, only two p-channel transistors P4, PS and the digital activation signal ACT are needed. This ensures that, in the second operating mode, no static loss current flows when the corresponding input signal at the input IN has levels that are respectively close to one of the supply potentials VDD, ground. This is because, in this case, opening of one of the two transistors P3; N1 which form the inverter I, and simultaneous complete turning off of the respective other transistor N1; P3, is guaranteed when the transistors P3, N1 are dimensioned accordingly.

I claim:

1. An input circuit, comprising:

a circuit input;

a circuit output;

a first supply terminal;

a second supply terminal;

a differential amplifier having an input connected to said circuit input and an output connected to said circuit output, said differential amplifier, including:

a first series circuit having at least one first transistor of a first channel type with a gate and a drain, a circuit node, and a second transistor of a second channel type with a gate and a drain disposed between said first supply terminal and said second supply terminal, said circuit node disposed between said at least one first transistor and said second transistor functioning as said output of said differential amplifier;

a second series circuit having at least one third transistor of said first channel type with a gate and a drain and a fourth transistor of said second channel type with a gate and a drain disposed between said first supply terminal and said second supply terminal;

said gate of said at least one first transistor connected to said gate of said at least one third transistor;

said gate and said drain of said at least one third transistor connected to one another;

said gate of said second transistor being said input of said differential amplifier;

a reference signal terminal; and said gate of said fourth transistor connected to said reference signal terminal;

an inverter having an inverter input connected to said circuit input and an inverter output connected to said circuit output, said inverter, including:

a third series circuit containing at least one fifth transistor of said first channel type with a gate and a drain, an inverter circuit node, and said second transistor disposed between said first supply terminal and said second supply terminal, said inverter circuit node disposed between said at least one fifth transistor and said second transistor being said inverter output of said inverter; and said gate of said at least one fifth transistor and said gate of said second transistor being said inverter input of said inverter; and said inverter and said differential amplifier receiving an activation signal defining two operating modes including a first operating mode and a second operating mode, said differential amplifier being activated and said inverter being deactivated in said first operating mode, and said differential amplifier being deactivated and said inverter being activated in said second operating mode.

2. The input circuit according to claim 1, including a shared switching element having a control input for receiving an enable signal, said first series circuit and said second series circuit of said differential amplifier are connected to said second supply terminal through said shared switching element.

3. The input circuit according to claim 2, including a further switching element having a control input receiving the activation signal, said at least one fifth transistor is connected to said first supply terminal through said further switching element.

4. The input circuit according to claim 3, wherein said further switching element is a sixth transistor of said first channel type.

5. The input circuit according to claim 4, including another switching element having a control input for receiving the activation signal, and said at least one third transistor has a current-carrying path disposed in parallel with said another switching element.

6. The input circuit according to claim 5, wherein said another switching element is a seventh transistor of said first channel type.

7. The input circuit according to claim 1, including a reference signal having different levels in said two operating modes being applied to said differential amplifier, and the activation signal being derived from said reference signal.

8. The input circuit according to claim 7, wherein the activation signal is produced by amplifying said reference signal.

9. The input circuit according to claim 7, wherein said reference signal has a first value being that of a supply potential applied at said second supply terminal in said second operating mode, and a second value being between the supply potential and a further supply potential supplied applied at said first supply terminal in said first operating mode.

* * * * *